United States Patent
Chen et al.

(10) Patent No.: US 7,208,204 B2
(45) Date of Patent: *Apr. 24, 2007

(54) THIN FILM MAGNETIC RECORDING MEDIA

(75) Inventors: Jingsheng Chen, Singapore (SG); Jian-Ping Wang, Minneapolis, MN (US)

(73) Assignee: Agency for Science, Technology and Research, Centros (SG)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 26 days.

(21) Appl. No.: 10/777,018

(22) Filed: Feb. 11, 2004

(65) Prior Publication Data

US 2004/0259362 A1    Dec. 23, 2004

(30) Foreign Application Priority Data

Feb. 11, 2003    (SG) .............................. 200300519-6

(51) Int. Cl.
 *B05D 3/00* (2006.01)
(52) U.S. Cl. ...................... 427/599; 427/598; 427/128; 427/180
(58) Field of Classification Search ................ 427/127, 427/128, 130, 598, 599, 376.6, 240, 180
See application file for complete search history.

(56) References Cited

U.S. PATENT DOCUMENTS

| | | | |
|---|---|---|---|
| 6,242,085 B1* | 6/2001 | Ryonai et al. | 428/332 |
| 2003/0091868 A1* | 5/2003 | Shimizu et al. | 428/694 TM |
| 2003/0235718 A1* | 12/2003 | Watanabe et al. | 428/694 TP |
| 2004/0115480 A1* | 6/2004 | Ejiri | 428/694 B |
| 2004/0134565 A1* | 7/2004 | Sun et al. | 148/105 |
| 2005/0084668 A1* | 4/2005 | Lamberton et al. | 428/328 |

* cited by examiner

*Primary Examiner*—Kirsten Jolley
(74) *Attorney, Agent, or Firm*—Fish & Richardson P.C.

(57) ABSTRACT

A method and apparatus for forming a thin film magnetic recording media, the method comprises generating magnetic nanoclusters from a target of magnetic material, crystallizing the magnetic nanoclusters, and depositing the magnetic nanoclusters onto a substrate to form a thin film of magnetic particles thereon. The magnetic nanoclusters are deposited onto the substrate after crystallized and therefore after the deposition. The apparatus comprises a first chamber, a second chamber connected to the first chamber, and a third chamber connected to the second chamber. The first chamber has a source for generating magnetic nanoclusters. The second chamber is to receive the magnetic nanoclusters and crystallize the magnetic nanocluster. The third chamber is to receive the crystallized magnetic nanoclusters from the second chamber and deposit the crystallized magnetic nanoclusters onto the substrate positioned therein.

24 Claims, 8 Drawing Sheets

THIN FILM MAGNETIC RECORDING MEDIA

RELATED APPLICATIONS

This application claims priority to Singapore Application Serial No. 200300519-6, filed Feb. 11, 2003, the contents of which are incorporated herein by reference in their entirety.

FIELD OF THE INVENTION

The present invention relates to magnetic recording media. In particular, it relates to thin film magnetic recording media for data storage devices.

BACKGROUND OF THE INVENTION

The rapid development of computer and information technology has resulted in great demand for high capacity storage devices. Currently, these storage devices are being pushed to their limits by applications as diverse as digital video editing and genomics. Therefore, the data storage industry is continually under pressure to increase the capacity of data storage devices. One of the primary methods to increase capacity is to increase the recording density of the magnetic recording media in most storage devices. To achieve an ultra-high recording density of, for example, about 100 Gbits/inch$^2$ or higher, magnetic recording media are required to possess a low remnant-thickness product (Mrδ), a high coercivity (Hc) as well as a high signal-to-media noise (S/Nm).

In a conventional magnetic recording media, such as a Cobalt (Co) based alloy, non-magnetic elements such as Chromium (Cr) and/or Boron (B) are incorporated into the thin film magnetic recording media to reduce the grain size as well as to reduce the intergranular coupling effect of the magnetic particles in the recording media. The result is a magnetic recording medium having a grain size of about 8–12 nanometers (nm) with a distribution width of about 20% or more. In this context, the term "distribution width" denotes the Full Width at Half Maximum (FWHM) height of the grain size distribution.

In order to obtain a high $S/N_m$ magnetic recording media, the grain size and their distribution width as well as the intergranular coupling between the magnetic gains must be properly controlled to further scale down.

Reduction of grain size for Co-based alloy recording media is limited by the thermal-instability of the magnetic grains or particles, commonly referred to as the "superparamagnetism" effect. Attempts to overcome this limitation are illustrated in "Effect Of Magnetic Anisotropy Distribution In Longitudinal Thin Film Media" by Hee et al (J. Appl. Phys., Volume 87, 5535–5537, 2000) and U.S. Pat. No. 6,183,606 to Kuo et al. The Hee article discloses a method using highly oriented media to allow further reduction of the grain size. In contrast, the Kuo patent uses $L1_0$ ordered FePt or CoPt material to form longitudinal or perpendicular magnetic recording media with very small magnetically stable grains.

While the above methods provide possibilities to obtain magnetically stabled grains with further reduced size in a first place, in the subsequent post-deposition annealing process, a high temperature, for example 600° C. or above, is to apply to the substrate in order to obtain recording media with an appropriate crystallized structure or with chemically ordered $L1_0$ FePt or CoPt. Unfortunately, this high temperature annealing process also increases gain size from about 10 nanometers nm) to about 3 nm in the deposited thin film, which eventually reduces the recording density. In addition, no solution is provided by these methods to control the grain distribution width. Due to the larger grain size and their wide distribution width, these films have presented rather poor recording properties, in particular a very low $S/N_m$. Moreover, the high-temperature annealing process is not compatible with existing magnetic recording media fabrication process and materials.

SUMMARY OF THE INVENTION

The present invention seeks to provide a method and apparatus for forming thin film magnetic recording media with higher recording density by virtue of the reduced grain size and distribution width. The present invention also provides a thin film magnetic recording medium formed accordingly. The present invention successfully eliminates the post annealing process necessary for the conventional methods as the deposition is done after the magnetic particles are crystallized, therefore avoids the grain growth after the formation of the thin film magnetic recording media by heating up the substrate for annealing purpose. According to the present invention the magnetic easy axis of the magnetic particles are finely controlled during the deposition process and further, the magnetic particles are well isolated from each other either before or during the deposition process.

In accordance with a first aspect of the present invention, there is provided a method for forming a thin film magnetic recording media, the method comprises generating magnetic nanoclusters from a target of magnetic material, crystallizing the magnetic nanoclusters, and depositing the magnetic nanoclusters onto a substrate to form a thin film of magnetic particles hereon. The magnetic nanoclusters are deposited onto the substrate after crystallized and therefore after the deposition, it is unnecessary to heat up the substrate.

In accordance with a second aspect of the present invention, there is provided an apparatus for forming a thin film magnetic recording media onto a substrate. The apparatus comprises a first chamber, a second chamber connected to the first chamber, and a third chamber connected to the second chamber. The first chamber has a source for generating magnetic nanoclusters. The second chamber is to receive the magnetic nanoclusters and crystallize the magnetic nanoclusters. The third chamber is to receive the crystallized magnetic nanoclusters from the second chamber and deposit the crystallized magnetic nanoclusters onto the substrate positioned therein.

In accordance with a third aspect of the present invention, there is provided a thin film magnetic recording medium, the medium comprises a non-magnetic substrate and a magnetic thin film layer disposed on the substrate. The magnetic thin film layer comprises magnetic particles isolated by a non-magnetic material, and the magnetic particles are formed on the substrate after crystallized.

DETAILED DESCRIPTION OF THE PREFERRED EMBODIMENTS

Figure 1A:
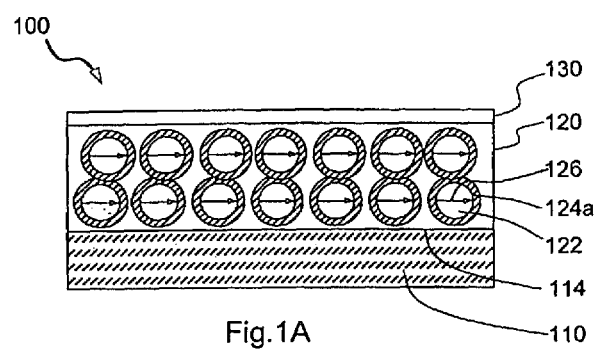
FIG. 1A is an enlarged cross sectional view showing a thin film magnetic recording medium according to one embodiment of the present invention.

FIG. 1A illustrates a thin film magnetic recording medium formed according to one embodiment of the present invention. The thin film magnetic recording medium 100 comprises a substrate 110, a thin film magnetic layer 120 deposited onto the substrate 110 and a protective overcoating 130 deposited on the thin film magnetic layer 120. The substrate 110 may be formed of a non-magnetic material such as silicon, glass, or aluminum alloy. The thin film magnetic layer 120 comprises a plurality of magnetic particles 122. Examples of magnetic materials that may be used to form magnetic particles 122 include Co, Fe, Ni, Sm, Pt, Cr, Ta, Nd, Pd, Gd, B, N, C, P, Ti, W, Mo, Ag, Ru, Au, Nb, Pb, Dy, a binary alloy of aforesaid elements, a ternary alloy of said elements, an oxide of Fe further comprising at least one of the said elements other than Fe, barium ferrite and strontium ferrite, carbide and nitride of the said elements. The preferred magnetic materials are, for example, CoPt, FePt or CoPd.

Figure 1B:
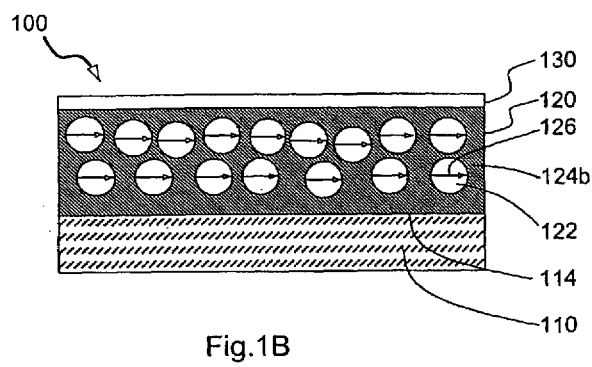
FIG. 1B is an enlarged cross sectional view showing a thin film magnetic recording medium according to another embodiment of the present invention.

The magnetic particles 122 are encapsulated by non-magnetic material 124a. The magnetic particles 122 are oriented with its magnetic easy axis 126 aligned parallel to a surface 114 of the substrate 110. In FIG. 1B, the magnetic particles 122 are disposed on the substrate 110 simultaneously with a non-magnetic material 124b, such that the magnetic particles 122 are dispersed within the non-magnetic material 124b. It should be appreciated that the intergranular coupling effect of the magnetic particles isolated by the non-magnetic material 124a (FIG. 1) and 124b (FIG. 2) in the above structure can be effectively reduced.

Figure 2A:
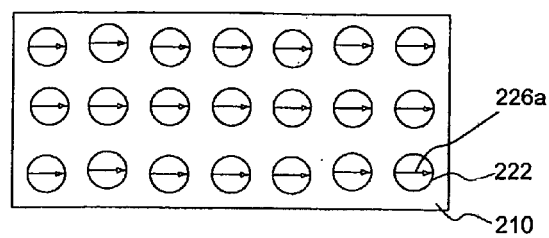
FIG. 2A is an enlarged top view showing a parallel magnetization orientation of the magnetic nanoparticles formed according to one embodiment of the present invention.
Figure 2B:
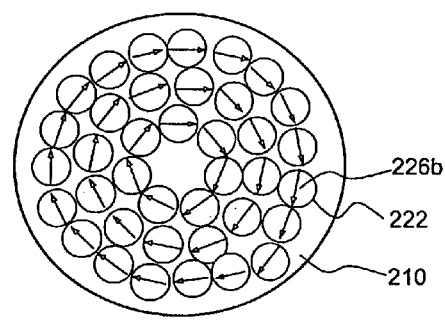
FIG. 2B is an enlarged top view showing a circumferential magnetization orientation of the magnetic nanoparticles formed according to another embodiment of the present invention.

FIGS. 2A and 2B show two examples of the highly oriented alignment of magnetic easy axis of the magnetic particles in the magnetic thin film for longitudinal recording media. FIG. 2A shows that the magnetic easy axes 226a of the magnetic particles 222 are parallel to the surface of the substrate 210. FIG. 2B shows that the magnetic easy axes 226a of the magnetic particles 222 are parallel to the surface of the substrate 210 and are circumferentially aligned.

Figure 3A:
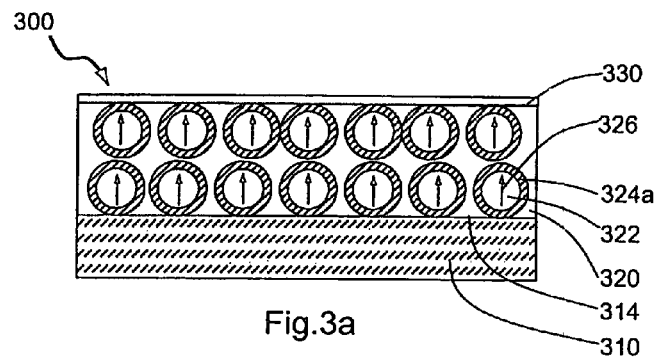
FIGS. 3A and 3B are enlarged cross sectional views showing perpendicular magnetization orientations of the magnetic nanoparticles formed according to the present invention.

FIG. 3A illustrates a thin film magnetic recording medium formed according to another embodiment of the present invention. The thin film magnetic recording medium 300 comprises a substrate 310, a thin film magnetic layer 320 deposited onto the substrate 110 and a protective overcoating 330 deposited on the thin film magnetic layer 120. The substrate 110 may be formed of a non-magnetic material made of, for example, a silicon wafer, glass or aluminum alloy. The thin film magnetic layer 320 includes a plurality of magnetic particles 322 comprising magnetic material, such as Co, Fe, Ni, Sm, Pt, Cr, Ta, Nd, Pd, Gd, B, N, C, P, Ti, W, Mo, Ag, Ru, Au, Nb, Pb, Dy, a binary alloy of aforesaid elements, a ternary alloy of said elements, an oxide of Fe further comprising at least one of the said elements other than Fe, barium ferrite and strontium ferrite, carbide and nitride of the said elements.

Figure 3B:
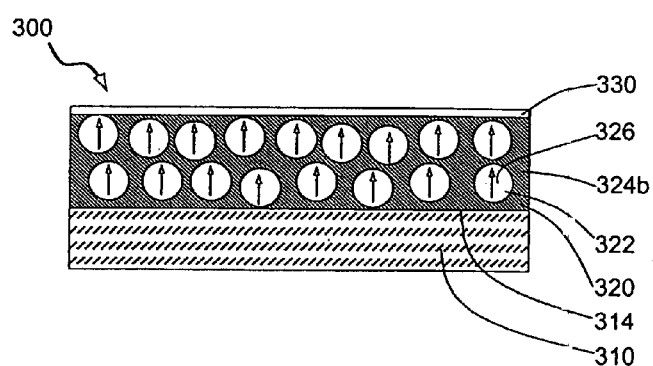

The magnetic particles 322 are encapsulated by a layer of non-magnetic material 324a according to the method illustrated below, and with its magnetic easy axis 326 aligned perpendicular to the surface 314 of the substrate 310. In FIG. 3B, the magnetic particles 322 are disposed on the substrate 310 simultaneously with a non-magnetic material 324b such that the magnetic particles 322 are dispersed within the non-magnetic material 324b.

Figure 4:
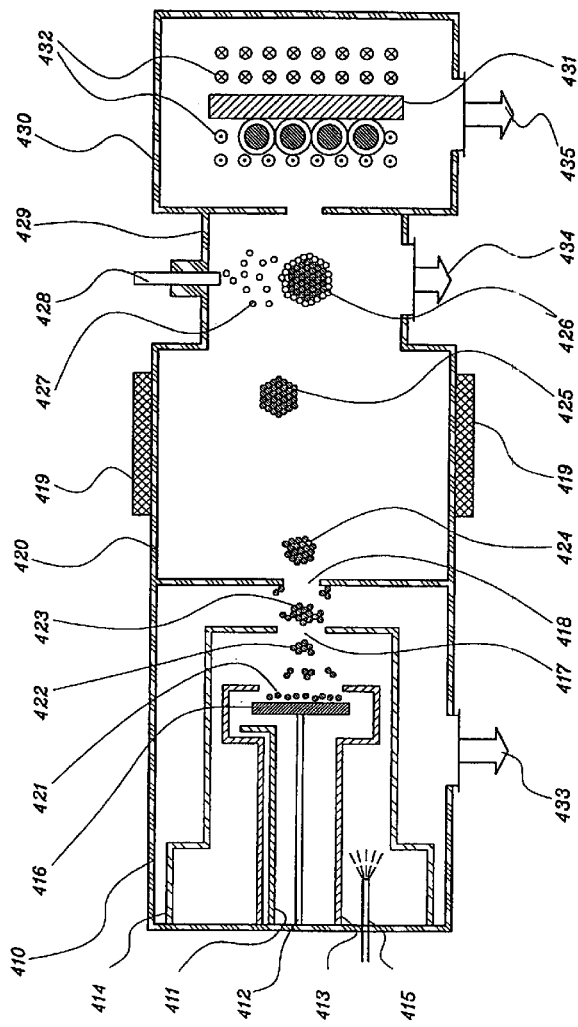
FIG. 4 is a schematic diagram showing an apparatus for forming magnetic thin film onto a substrate according to one embodiment of the present invention.

As shown in FIG. 4, an apparatus for forming magnetic thin film onto a substrate according to one embodiment of the present invention comprises a cluster-forming chamber 410, a healing chamber 420, an encapsulation chamber 429 and a deposition chamber 430. The cluster-forming chamber 410 comprises a target 416 made of a magnetic material selected from, for example, Co, Fe, Ni, Sm, Pt, Cr, Ta, Nd, Pd, Gd, B, N, C, P, Ti, W, Mo, Ag, Ru, Au, Nb, Pb, Dy, a binary alloy of aforesaid elements, a ternary alloy of said elements, an oxide of Fe further comprising at least one of the said elements other than Fe, barium ferrite and strontium ferrite, carbide and nitride of the said elements. The cluster-forming chamber 410 comprises a power unit 412 connected to an anode 413 and the target 416 (which is used as a cathode). The cluster-forming chamber 410 also includes a first conduit 411 for supplying a first gas, such as argon (Ar) and a second conduit 415 for supplying a second gas such as helium (He). The Ar serves as both sputtering gas and aggregation gas while the He is used to control the cluster size and initial distribution width due to its high heat-transfer ability. A liquid nitrogen cooling unit 414 is also provided for promoting the formation of the cluster with desired size. Examples of the power unit 412 are a direct current (DC) or radio frequency (RF) power supply. The cluster-forming chamber 410 preferably operates at a working pressure in a range of about 0.1 Torr to 1 Torr. which is higher than that of the conventional sputtering pressure. The purpose of using a pressure for sputtering in this level is to provide more collision chance of the particle and to form large particle. The parameters of controlling the particle size include gas pressure, gas flow rate, ratio of Ar and He. A diaphragm 417 is provided at one end of the nitrogen cooling unit. Another diaphragm 418 is provided to connect the cluster-forming chamber 410 and the heating chamber 420.

Pumping systems 433, 434, and 435 are provided for adjusting the pressure of the cluster-forming chamber 410, the encapsulation chamber 429 and the deposition chamber 430. The pressure of the deposition chamber 430 is maintained at a level lower than the pressure of the other two chambers to enable cluster transportation from the cluster-forming chamber 410 to the deposition chamber 430. The pressure range of the cluster-forming chamber 410, the encapsulation chamber 429 and the deposition chamber 430 can be set to about 0.1–1 Torr, $10^{-4}$ Torr, and $10^{-6}$ Torr, respectively.

At the start of the process, energized argon gas ions (Ar+) are accelerated towards the target 416 to eject atoms 421 from the target 16 upon impact. The ejected atoms 421 are then decelerated by collision with the argon gas (Ar+) and start to agglomerate to form clusters. The liquid nitrogen cooling unit 414 and helium supplied from the conduit 415 aid in cooling the ejected atoms 421 to form a set of clusters 422.

After being exposed to the noble gases (Ar+), the clusters 422 then move through the diaphragm 417 and agglomerate together to form a set of larger clusters 423, which continue move onwards to the heating chamber 420 through diaphragm 418, and further form final clusters 424 in the heating chamber 420. The clusters 424 may consist of several hundred magnetic atoms up to several million magnetic atoms, which are loosely bonded with each other. In the process atoms are agglomerated together to form clusters and more atoms are attached to the boundary portions of the clusters continuously. As a result, the clusters will be formed with larger sized agglomerates located at the center portion and with relatively smaller sized agglomerates locates at the boundary portion. Upon passing through the diaphragm 418, smaller sized agglomerates located at the boundary portions of the clusters 423 can be trimmed off by the diaphragm. As a result, the clusters 424 passing through the diaphragm will have the smaller sized agglomerates removed. Therefore, clusters with a distribution width smaller than that of the clusters 423 before the diaphragm 418 can be obtained. In this embodiment, the dimension of the clusters 424 is in a range of about 1 nm to 20 nm and a distribution width of about 10% or less.

It should be appreciated according to the above illustration that various parameters may be adjusted to control the dimension and distribution width including the pressure of the cluster-forming chamber 410, the sputtering rate of the target materials, the ratio of the helium to other noble gases, the distance between the target 416 and the diaphragm 417 and the size of the diaphragms 417 and 418, etc.

The apparatus further comprises a number of heaters 419 for heating the gas-phase clusters 424 to a temperature of about 900° C. to achieve crystallization Examples of the heaters 419 include a resistance furnace heater or a lamp heater. After heating, the clusters 424 are converted into crystallized magnetic nanoclusters 425 with a desired crystalline structure for data storage purpose.

The magnetic nanoclusters 425 are then moved to the encapsulation chamber 429. A surfactant 427 is then supplied to the encapsulation chamber by a spray nozzle 428, such as a nebuliser. The surfactant is preferably a material which can be absorbed by the magnetic nanocrystals 425 to form encapsulated magnetic nanocrystals 426. The surfactant 427 may be selected from a group of organic materials, including fatty acids, alkyl thiols, alkyl diulfides, alkyl nitriles and alkyl isonitiles, which is an end group that is attracted to the magnetic nanocrystals 425. The surfactant may also be a methylene having a chain 8 to 12 units long, which provides steric repulsion to prevent the magnetic nanocrystals 425 from adhering to the substrate in the subsequent deposition process. The term "8 to 12 units long" denotes that for polymer materials, its structure is chain-like, for example "8 unit" refer to the chain structure of C—C—C—C—C—C—C—C (C means carbon, other bonds of carbon bond to the function group such as hydrogen, —OH etc.)

The encapsulated magnetic nanocrystals 426 are then transported into the deposition chamber 430 to be deposited onto the substrate 431. As illustrated above, because the magnetic nanocrystals 425 are crystallize before reaching the substrate 431, the magnetic nanocrystals 425 are usually a single domain. Because the energy of the magnetic nanocrystals 425 is very low, the encapsulated magnetic nanocrystals 426 will remain intact after deposition onto the substrate.

An external magnetic field 432 is provided adjacent to the substrate 431, which forms a relatively uniform magnetic field direction as illustrated in FIG. 4. When the encapsulated magnetic nanoclusters 426 reach the substrate 431 they will be aligned by following the direction of the magnetic field 432 whilst depositing on the substrate 431. The magnetic thin firm can then be formed with highly oriented magnetic easy axis along a predetermined direction controlled by the magnetic field 432.

Figure 5A:
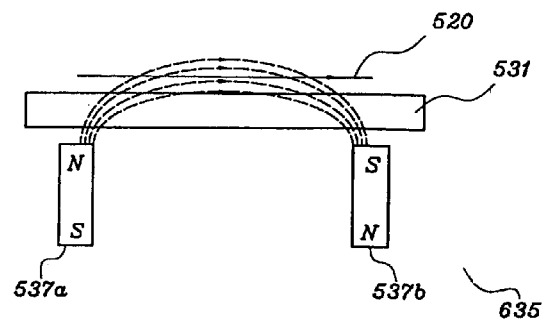
FIGS. 5A, 5B and 5C are schematic diagrams showing various configurations of the magnetic field according to the present invention.
Figure 5B:
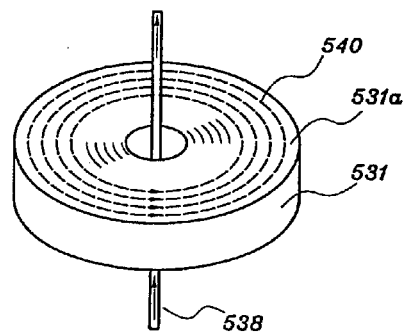

FIGS. 5A and 5B show alternative configurations of a magnetic field adjacent to a substrate for aligning the orientation of the magnetic particles. In FIG. 5A, two permanent magnets or electromagnets 537a and 537b are placed underneath a substrate 531. The north magnetic pole of magnet 537a and the south magnetic pole of magnet 537b are placed adjacent to the substrate 530 to generate a magnetic field 520. The magnetic field 520 aligns the magnetic particles along a direction parallel to the top surface 531a of the substrate 531 during deposition. In addition, the substrate 531 and the magnets 537a, 537b may be rotated during the deposition process to achieve uniformity of the magnetic thin film deposition.

As shown in FIG. 5B a circumferentially-oriented magnetic field 540 may be obtained by passing through an electrical wire 538 through the center of the substrate 531. The magnetic field 540 aligns the magnetic clusters during deposition along a direction parallel to and circumferential with respect to the a top surface 531a of the substrate 531.

Figure 5C:
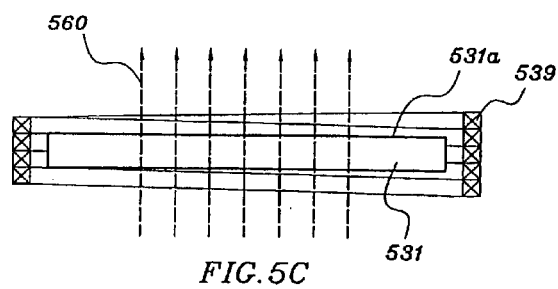

As shown in FIG. 5C, a magnetic field 560 with a direction perpendicular to a top surface 531a of the substrate 531 may be obtained by placing a solenoid, 539 around the substrate 531. The solenoid aligns the magnetic particles during deposition along a direction perpendicular to the substrate surface. It should be appreciated that magnetic thin films having different magnetic orientations may be obtained by applying an appropriate magnetic field adjacent to the substrate.

Figure 6:
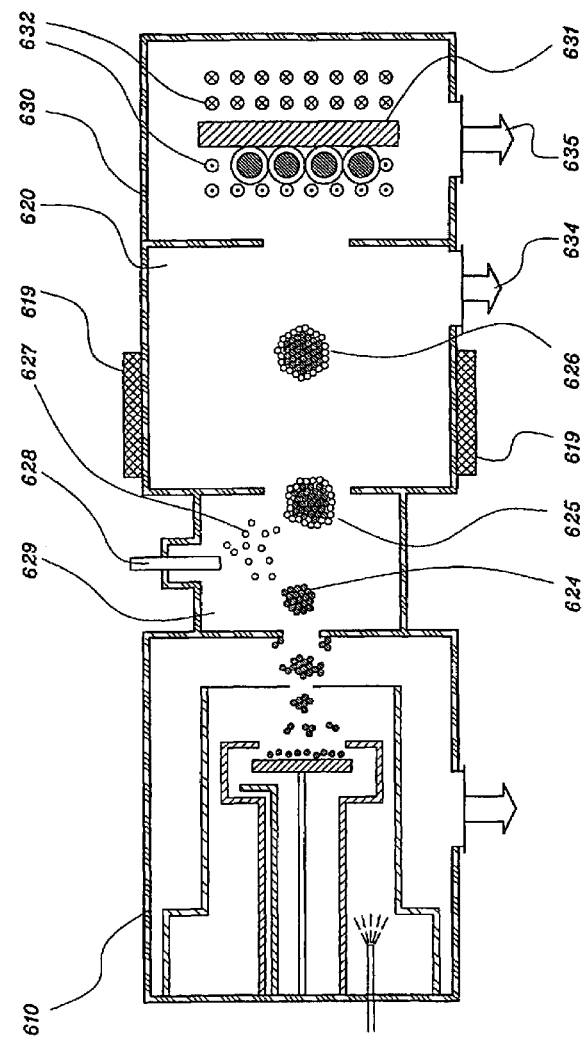
FIG. 6 is a schematic diagram showing an apparatus for forming magnetic thin film onto a substrate according to another embodiment of the present invention.

FIG. 6 shows an apparatus for forming magnetic thin film onto a substrate according to another embodiment of the present invention. The apparatus comprises a cluster-forming chamber 610, a heating chamber 620, an encapsulation chamber 629, and a deposition chamber 630. In this embodiment, the encapsulation chamber 629 is coupled between the cluster-forming chamber 610 and the heating chamber 620.

The loosely bonded magnetic nanoclusters 624 formed by the cluster-forming chamber 610 are transported into the encapsulation chamber 629. A spray of organic solvent or surfactant 627 are supplied by the nozzle 628 into the encapsulation chamber 629 to mix with the magnetic nanoclusters 624 to form the encapsulated nanoclusters 625.

The encapsulates nanoclusters 625 are transported into the heating chamber 620 thereafter. The encapsulated nanoclusters 624a are heated by the heaters 619 to a temperature of about 900° C. to form crystalized magnetic nanoclusters 626. At the same time, the organic materials encapsulating the nanoclusters will be carbonized by the heating process, therefore the crystallized magnetic nanoclusters 626 are encapsulated with a layer of amorphous carbon. The encapsulated magnetic nanoclusters are then deposited onto the substrate 631 located in the deposition chamber 630.

Figure 7:
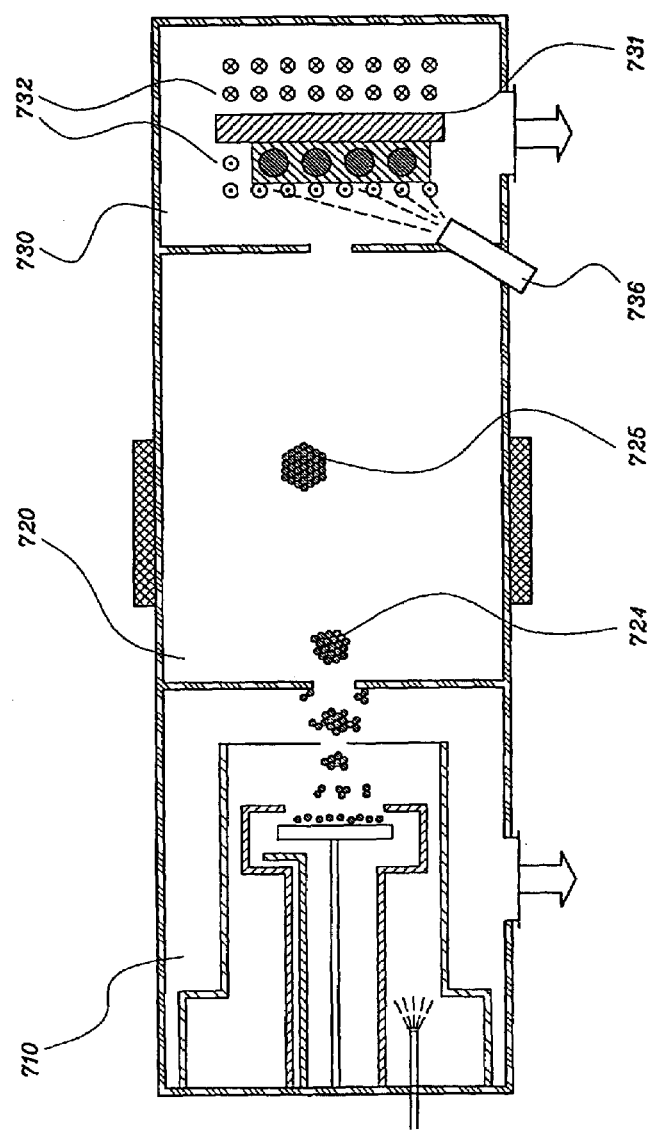
FIG. 7 is a schematic diagram showing an apparatus for forming magnetic thin film onto a substrate according to a further embodiment of the present invention.

FIG. 7 shows an apparatus for forming magnetic thin film onto a substrate according to a further embodiment of the present invention. The apparatus comprises a cluster-forming chamber 710, a heating chamber 720 and a deposition chamber 730. In this embodiment, the loosely bonded magnetic nanoclusters 724 are formed in the cluster-forming chamber 710, and transported into the heating chamber 720.

After heating in the heating chamber 720, the loosely bonded nanoclusters 724 become close-packed and crystallized magnetic nanoclusters 725. The magnetic nanoclusters 725 are then transported into the deposition chamber 730 to be deposited onto substrate 731. At the same time, non-magnetic materials are also deposited onto the substrate 731 by a source 736. Examples of non-magnetic materials that may be used include C, $SiO_2$, $Si_3N_4$ BN and/Dr carbon hydrogenate polymer.

Figure 8:
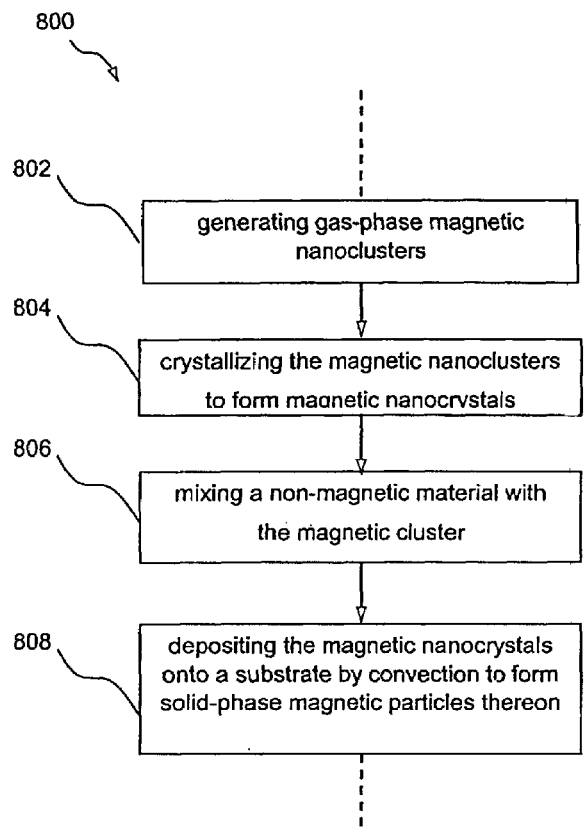
FIG. 8 is a flow chart showing a method for forming magnetic thin film onto a substrate according to one embodiment of the present invention.

FIG. 8 shows a method 800 for forming a thin film magnetic recording media according to the present invention. In a first block 802, magnetic nanocluster are generated from a target. In a next block 804, the magnetic nanoclusters are heated to a crystallization temperature, whereby the magnetic nanoclusters are crystallized so that to process necessary properties for data storage purpose. Thereafter in a further block 806, the crystallized magnetic nanoclusters mixed up with a non-magnetic material. The non-magnetic material encapsulate the crystallized magnetic nanoclusters and therefore, the intergranular coupling effect of the magnetic particles will be reduced. In a next block 808, the encapsulated magnetic nanoclusters are disposed onto a substrate to form solid-phase magnetic particles.

It should be appreciated that according to the above method, since the desired crystalline structure are obtained before deposition, the substrate after the magnetic nanoclusters deposited thereon needs not be heated up for annealing purpose. Accordingly, the grain growth by the post-deposition annealing is successfully eliminated.

What is claimed is:

1. A method for forming a thin film magnetic recording media, the method comprising:
   generating magnetic nanoclusters in gas phase;
   heating the magnetic nanoclusters;
   crystallizing the magnetic nanoclusters; and
   depositing the magnetic nanoclusters onto a substrate to form a thin film of magnetic particles thereon;
   wherein the generating, heating, crystallizing, and depositing steps are performed sequentially.

2. The method as recited in claim 1, further comprising mixing and encapsulating the magnetic nanoclusters with a non-magnetic material, wherein the non-magnetic material comprises an organic solvent.

3. The method as recited in claim 1, further comprising mixing and encapsulating the magnetic nanoclusters with a non-magnetic material, wherein the non-magnetic material comprises a surfactant.

4. The method as recited in claim 1, further comprising mixing the magnetic nanoclusters with a non-magnetic material, wherein the mixing is performed before the magnetic nanoclusters are crystallized.

5. The method as recited in claim 4, wherein crystallizing of the magnetic nanoclusters comprises heating the magnetic nanoclusters and fixing the non-magnetic material onto the magnetic nanoclusters.

6. The method as recited in claim 1, further comprising providing a magnetic field adjacent to the substrate to control the orientation of the magnetic particles during deposition.

7. The method as recited in claim 6, wherein each of the magnetic particles has an easy axis parallel to a surface of the substrate.

8. The method as recited in claim 7, wherein the easy axes are parallel relative to each other.

9. The method as recited in claim 6, wherein each of the magnetic particles has an easy axis perpendicular to a surface of the substrate.

10. A method for forming a thin film magnetic recording media, the method comprising:
    generating magnetic nanoclusters;
    mixing the magnetic nanoclusters with a non-magnetic material;
    crystallizing the magnetic nanoclusters; and
    depositing the magnetic nanoclusters onto a substrate to form a thin film of magnetic particles thereon;
    wherein the generating, mixing, crystallizing, and depositing steps are performed sequentially.

11. The method as recited in claim 10, further comprising encapsulating the magnetic nanoclusters with the non-magnetic material, wherein the non-magnetic material comprises an organic solvent.

12. The method as recited in claim 10, further comprising encapsulating the magnetic nanoclusters with the non-magnetic material, wherein the non-magnetic material comprises a surfactant.

13. The method as recited in claim 10, wherein crystallizing of the magnetic nanoclusters comprises heating the magnetic nanoclusters and fixing the non-magnetic material onto the magnetic nanoclusters.

14. The method as recited in claim 10, further comprising providing a magnetic field adjacent to the substrate to control the orientation of the magnetic particles upon deposition.

15. The method as recited in claim 14, wherein each of the magnetic particles has an easy axis parallel to a surface of the substrate.

16. The method as recited in claim 15, wherein the easy axes are parallel relative to each other.

17. The method as recited in claim 14, wherein each of the magnetic particles has an easy axis perpendicular to the surface of the substrate.

18. A method for forming a thin film magnetic recording media, the method comprising:
    generating magnetic nanoclusters;
    crystallizing the magnetic nanoclusters; and
    depositing the magnetic nanoclusters onto a substrate to form a thin film of magnetic particles thereon,
    wherein the generating, crystallizing, and depositing steps are performed sequentially and the method further comprises providing a magnetic field adjacent to the substrate to control the orientation of the magnetic particles during deposition.

19. The method as recited in claim 18, further comprising mixing and encapsulating the magnetic nanoclusters with the non-magnetic material, wherein the non-magnetic material comprises an organic solvent.

20. The method as recited in claim 18, further comprising mixing and encapsulating the magnetic nanoclusters with the non-magnetic material, wherein the non-magnetic material comprises a surfactant.

21. The method as recited in claim 18, further comprising mixing the magnetic nanoclusters with the non-magnetic material, wherein the mixing is performed before the magnetic nanoclusters are crystallized, and wherein crystallizing of the magnetic nanoclusters comprises heating the magnetic nanoclusters and fixing the non-magnetic material onto the magnetic nanoclusters.

22. The method as recited in claim 18, wherein each of the magnetic particles has an easy axis parallel to a surface of the substrate.

23. The method as recited in claim 22, wherein the easy axes are parallel relative to each other.

24. The method as recited in claim 18, wherein each of the magnetic particles has an easy axis perpendicular to a surface of the substrate.

* * * * *